United States Patent
Lin et al.

(10) Patent No.: US 7,842,550 B2
(45) Date of Patent: Nov. 30, 2010

(54) METHOD OF FABRICATING QUAD FLAT NON-LEADED PACKAGE

(75) Inventors: Chun-Ying Lin, Tainan County (TW); Geng-Shin Shen, Tainan County (TW); Po-Kai Hou, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 34 days.

(21) Appl. No.: 12/332,362

(22) Filed: Dec. 11, 2008

(65) Prior Publication Data
US 2010/0120201 A1  May 13, 2010

(30) Foreign Application Priority Data
Nov. 7, 2008  (TW)  .............. 97143129 A (51) Int. Cl.
*H01L 21/00* (2006.01)
(52) U.S. Cl. ............ 438/112; 438/113; 438/461; 438/462; 257/E25.01; 257/E25.023; 257/E23.169; 257/E23.532
(58) Field of Classification Search .......... None
See application file for complete search history.

(56) References Cited

U.S. PATENT DOCUMENTS

| | | | |
|---|---|---|---|
| 6,001,671 A | 12/1999 | Fjelstad | |
| 6,489,218 B1 * | 12/2002 | Kim et al. | 438/460 |
| 6,800,508 B2 * | 10/2004 | Kimura | 438/123 |
| 7,125,747 B2 * | 10/2006 | Lee et al. | 438/112 |
| 7,214,326 B1 | 5/2007 | Yang et al. | |
| 7,371,613 B2 * | 5/2008 | Shimanuki | 438/113 |
| 2006/0199308 A1 * | 9/2006 | Lee et al. | 438/110 |

* cited by examiner

*Primary Examiner*—Alonzo Chambliss
(74) *Attorney, Agent, or Firm*—Jianq Chyun IP Office (57) ABSTRACT

A method of fabricating a quad flat non-leaded package includes first forming a patterned conductive layer on a sacrificial layer. The patterned conductive layer includes a number of lead sets. A number of chips are attached to the sacrificial layer. Each of the chips is surrounded by one of the lead sets. Each of the chips is electrically connected to one of the lead sets, and a molding compound is formed on the sacrificial layer to cover the patterned conductive layer and the chips. The molding compound and the patterned conductive layer are then cut and singulated, and the sacrificial layer is pre-cut to form a number of recesses on the sacrificial layer. After the molding compound and the patterned conductive layer are cut and singulated and the sacrificial layer is pre-cut, the sacrificial layer is removed.

17 Claims, 7 Drawing Sheets

METHOD OF FABRICATING QUAD FLAT NON-LEADED PACKAGE

CROSS-REFERENCE TO RELATED APPLICATION

This application claims the priority benefit of Taiwan application serial no. 97143129, filed on Nov. 7, 2008. The entirety of the above-mentioned patent application is hereby incorporated by reference herein and made a part of this specification.

BACKGROUND OF THE INVENTION

1. Field of the Invention

The present invention relates to a method of fabricating a quad flat package (QFP). More particularly, the present invention relates to a method of fabricating a quad flat non-leaded (QFN) package.

2. Description of Related Art

Semiconductor industry is one of the most rapidly advanced hi-tech industries in recent years. With progress of electronic technologies, hi-tech electronic industries have developed thin, light, short, small, and compact products which are user-friendly and are equipped with better functions than ever. In the semiconductor industry, production of integrated circuits (ICs) is mainly divided into three stages including IC design, IC process, and IC package. Here, the IC package is carried out not only for preventing chips from being polluted by dusts and affected by external temperature and moisture but also for electrically connecting the chips to external circuits.

Among a variety of packages formed by performing a semiconductor package process, a quad flat non-leaded (QFN) package characterized by short signal-transmitting traces and fast signal-transmitting speed is a mainstream low pin count package and is suitable for transmitting high-frequency signals.

In general, during fabrication of the QFN package, a plurality of chips are firstly arranged on a lead frame. The lead frame includes a plurality of lead sets connected to one another, and each of the chips is surrounded by one of the lead sets, respectively. Next, each of the chips is electrically connected to one of the corresponding lead sets through wire bonding, respectively. Thereafter, a molding compound is formed to completely cover the lead frame and the chips. Finally, the molding compound is cut and singulated to form a plurality of QFN packages.

SUMMARY OF THE INVENTION

The present invention is directed to a method of fabricating a quad flat non-leaded (QFN) package. In said method, a plurality of singulated QFN packages can be formed by performing a cutting process and removing a sacrificial layer.

The present invention is further directed to a method of fabricating a QFN package for economizing the use of a molding compound and reducing abrasion of cutting tools during implementation of a cutting process.

A method of fabricating a QFN package in the present invention includes first forming a patterned conductive layer on a sacrificial layer. The patterned conductive layer includes a plurality of lead sets. A plurality of chips are attached to the sacrificial layer, and each of the chips is surrounded by one of the lead sets, respectively. Besides, each of the chips is electrically connected to one of the lead sets, and a molding compound is formed on the sacrificial layer to cover the patterned conductive layer and the chips. The molding compound and the patterned conductive layer are then cut and singulated, and the sacrificial layer is partially cut to form a plurality of recesses on the sacrificial layer. After the molding compound and the patterned conductive layer are cut and singulated and the sacrificial layer is partially cut, the sacrificial layer is removed.

In an embodiment of the present invention, the method of fabricating the QFN package further includes providing a transferring substrate before the molding compound and the patterned conductive layer are cut and singulated and the sacrificial layer is removed. Additionally, the cut and singulated molding compound is attached to the transferring substrate.

In an embodiment of the present invention, the method of fabricating the QFN package further includes removing the transferring substrate after the sacrificial layer is removed.

In an embodiment of the present invention, the molding compound is formed on the entire sacrificial layer.

The present invention further provides a method of fabricating a QFN package. In said method, a patterned conductive layer is first formed on a sacrificial layer. The patterned conductive layer includes a plurality of lead sets constituted by leads. A plurality of chips are attached to the sacrificial layer, and each of the chips is surrounded by one of the lead sets, respectively. Besides, each of the chips is electrically connected to one of the lead sets, and a plurality of molding compounds are formed on the sacrificial layer to cover the patterned conductive layer and the chips, respectively. The patterned conductive layer is then cut and singulated, and the sacrificial layer is partially cut to form a plurality of recesses on the sacrificial layer. After the patterned conductive layer is cut and singulated and the sacrificial layer is partially cut, the sacrificial layer is removed.

In an embodiment of the present invention, a method of forming the patterned conductive layer includes forming a conductive layer on the sacrificial layer and removing a portion of the conductive layer, so as to form the patterned conductive layer.

In an embodiment of the present invention, a method of removing the portion of the conductive layer includes performing a photolithography/etching process.

In an embodiment of the present invention, a method of forming the patterned conductive layer includes forming a patterned photoresist layer on the sacrificial layer. Next, the patterned conductive layer is formed on a portion of the sacrificial layer with use of the patterned photoresist layer as a mask. Here, the portion of the sacrificial layer is not covered by the patterned photoresist layer. After that, the patterned photoresist layer is removed.

In an embodiment of the present invention, the sacrificial layer is a metal layer or an insulating layer.

In an embodiment of the present invention, a method of forming the patterned conductive layer on the portion of the sacrificial layer that is not covered by the patterned photoresist layer includes performing an electroplating process.

In an embodiment of the present invention, the method of fabricating the QFN package further includes forming a die pad surrounded by the leads during the formation of the lead sets.

In an embodiment of the present invention, each of the chips and one of the corresponding lead sets are electrically connected through a plurality of conductive wires.

In the method of fabricating the QFN package of the present invention, the cut package structure is attached to the transferring substrate, and the sacrificial layer and the transferring substrate are sequentially removed, so as to form a plurality of QFN packages arranged orderly.

Besides, in the method of fabricating the QFN package of the present invention, the use of a molding compound is economized and abrasion of the cutting tools is reduced by forming a plurality of molding compounds respectively covering the patterned conductive layer and the chips.

In order to make the aforementioned and other features and advantages of the present invention more comprehensible, an embodiment accompanied with figures is described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
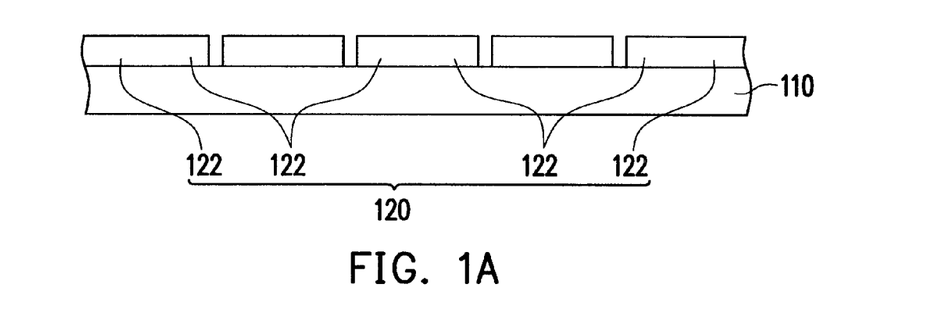
FIGS. 1A to 1F are schematic cross-sectional views illustrating a method of fabricating a QFN package according to an embodiment of the present invention.

FIGS. 1A to 1F are schematic cross-sectional views illustrating a method of fabricating a QFN package according to an embodiment of the present invention. Referring to FIG. 1A, a patterned conductive layer 120 is first formed on a sacrificial layer 110. Here, the patterned conductive layer includes a plurality of lead sets constituted by leads 122 (the reference number 122 described herein refers to both the lead sets and the leads). A material of the leads 122 is, for example, copper.

Figure 1B:
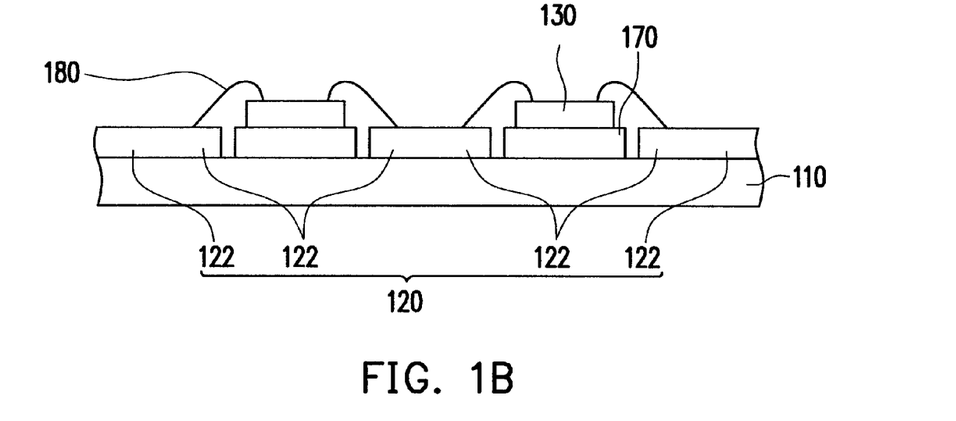
Figure 1C:
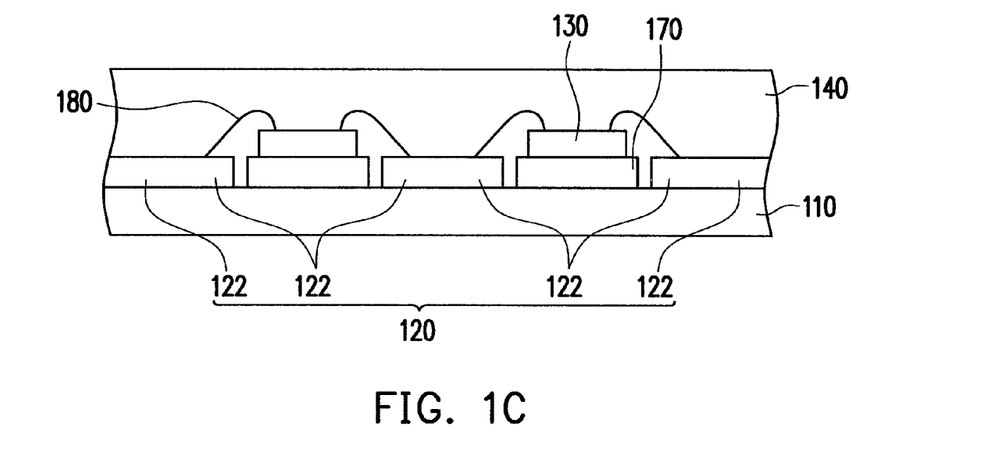

Next, referring to FIGS. 1B and 1C, a plurality of chips 130 are attached to the sacrificial layer 110. Each of the chips 130 is respectively surrounded by and electrically connected to one of the lead sets 122, and a molding compound 140 is formed on the sacrificial layer 110 to cover the patterned conductive layer 120 and the chips 130. Here, the molding compound 140 is, for example, formed by epoxy resin.

Figure 1D:
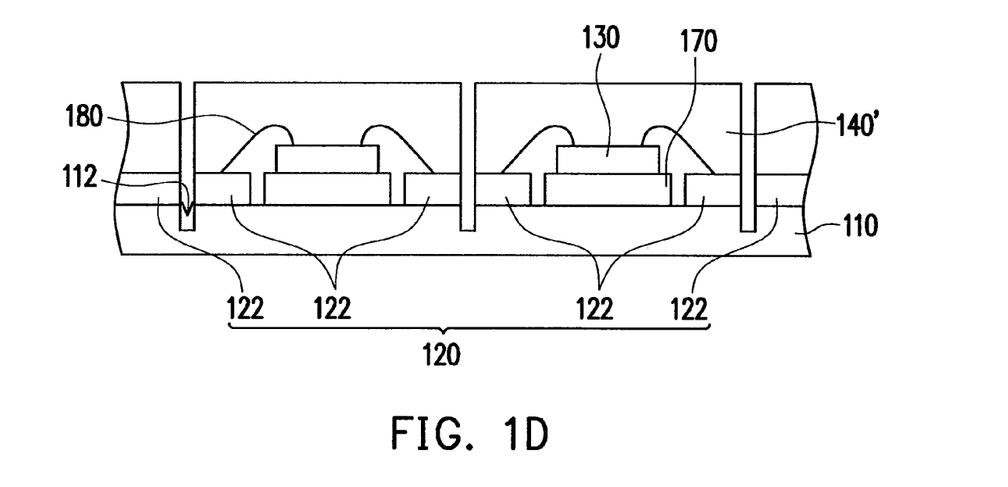
Figure 1E:
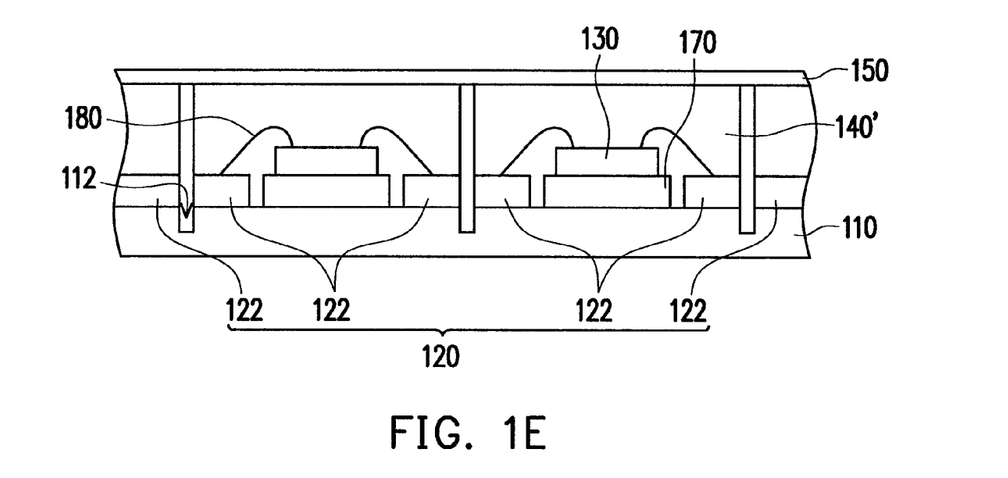
Figure 1F:
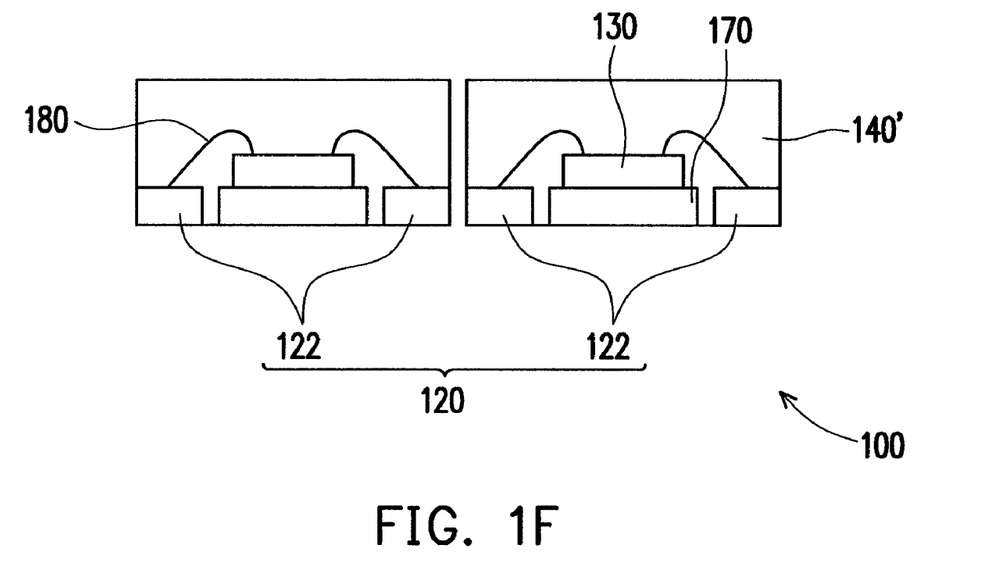

Thereafter, referring to FIGS. 1D and 1F, the molding compound 140 is cut and singulated to form a plurality of molding compounds 140', and the patterned conductive layer 120 is cut. After the molding compound 140 and the patterned conductive layer 120 are cut and singulated, the sacrificial layer 110 is removed, so as to form a plurality of QFN packages 100.

Referring to FIG. 1C, in the present embodiment, a molding compound is formed on the entire sacrificial layer 110. As indicated in FIG. 1D, when the molding compound 140 and the patterned conductive layer 120 are cut and singulated, the sacrificial layer 110 is partially cut for forming a plurality of recesses 112 on the sacrificial layer 110. Here, the cutting process is, for example, a blade saw process, a laser saw process, or a normal punch process. After that, referring to FIG. 1E, a transferring substrate 150 is provided, such that each of the molding compounds 140' is attached to the transferring substrate 150. Finally, the sacrificial layer 110 and the transferring substrate 150 are sequentially removed to form a plurality of QFN packages 100 shown in FIG. 1F. Here, the sacrificial layer 110 is, for example, a tape which can or cannot be cured by ultraviolet light, a blue tape for polishing wafers, a metal layer, or any other insulating material. The transferring substrate 150 is, for example, a vacuum suction plate, a vacuum suction nozzle, or any other transferring carrier equipped with sucking or adhering functions. In the present embodiment, the sacrificial layer 110 is a photo-curable tape which can be cured by ultraviolet light. After the recesses 112 are formed on the sacrificial layer 110, adhesion between the photo-curable tape and the package is reduced by ultraviolet light irradiation. Next, the transferring substrate 150 equipped with the vacuum suction function is used to separate the molding compounds 140' from the sacrificial layer 110. Finally, the transferring substrate 150 is removed.

According to the present embodiment, each of the molding compounds 140' connected to the sacrificial layer 110 after the cutting process is performed is attached to the transferring substrate 150, such that relative positions of each of the molding compounds 140' can be maintained during the removal of the sacrificial layer 110. Thereby, a plurality of regularly arranged QFN packages 100 are formed.

According to the present embodiment, each of the molding compounds 140' connected to the sacrificial layer 110 after the pre-cutting process is performed is attached to the transferring substrate 150, such that relative positions of each of the molding compounds 140' can be maintained during the removal of the sacrificial layer 110. Thereby, a plurality of regularly arranged QFN packages 100 are formed.

Figure 2A:
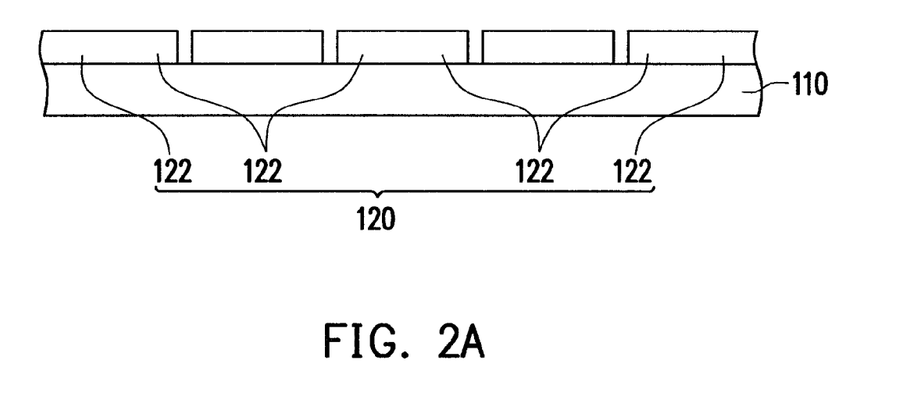
FIGS. 2A to 2E are schematic cross-sectional views illustrating a method of fabricating a QFN package according to another embodiment of the present invention.

FIGS. 2A to 2E are schematic cross-sectional views illustrating a method of fabricating a QFN package according to another embodiment of the present invention. Referring to FIG. 2A, a patterned conductive layer 120 is first formed on a sacrificial layer 110. Here, the patterned conductive layer 120 includes a plurality of lead sets 122. A material of the leads 122 is, for example, copper.

Figure 2B:
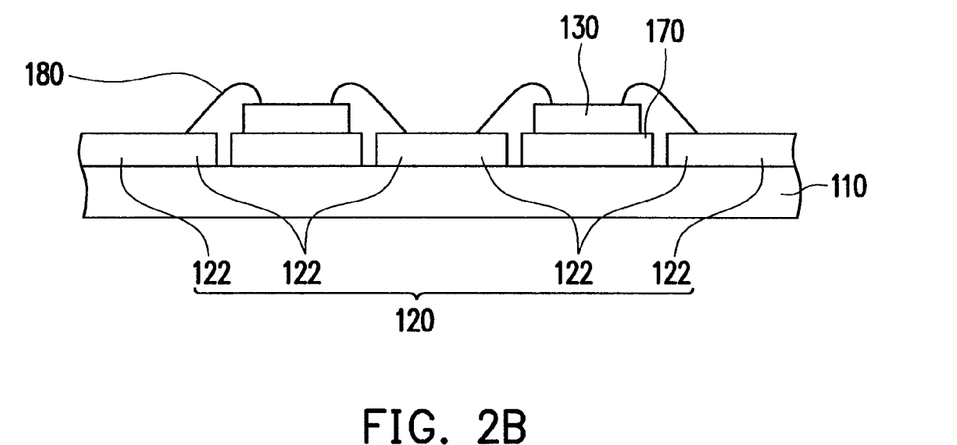
Figure 2C:
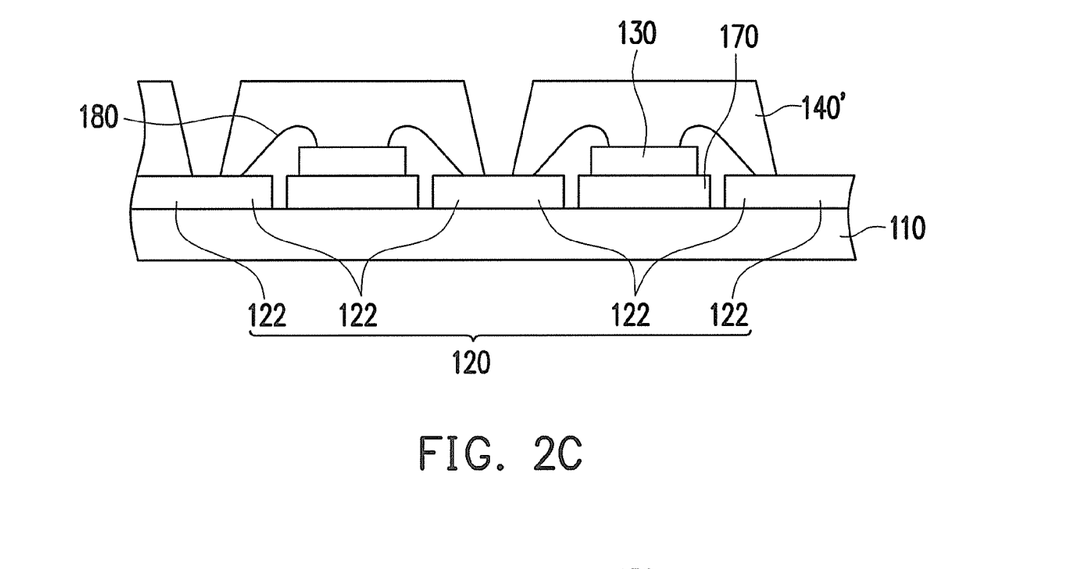

Next, referring to FIGS. 2B and 2C, a plurality of chips 130 are attached to the sacrificial layer 110, and each of the chips 130 is respectively surrounded by one of the lead sets 122. In addition, each of the chips 130 is electrically connected to one of the lead sets 122, and a plurality of molding compounds 140' are formed on the sacrificial layer 110 to respectively cover the patterned conductive layer 120 and the chips 130. Here, the molding compounds 140' are, for example, formed by epoxy resin.

Figure 2D:
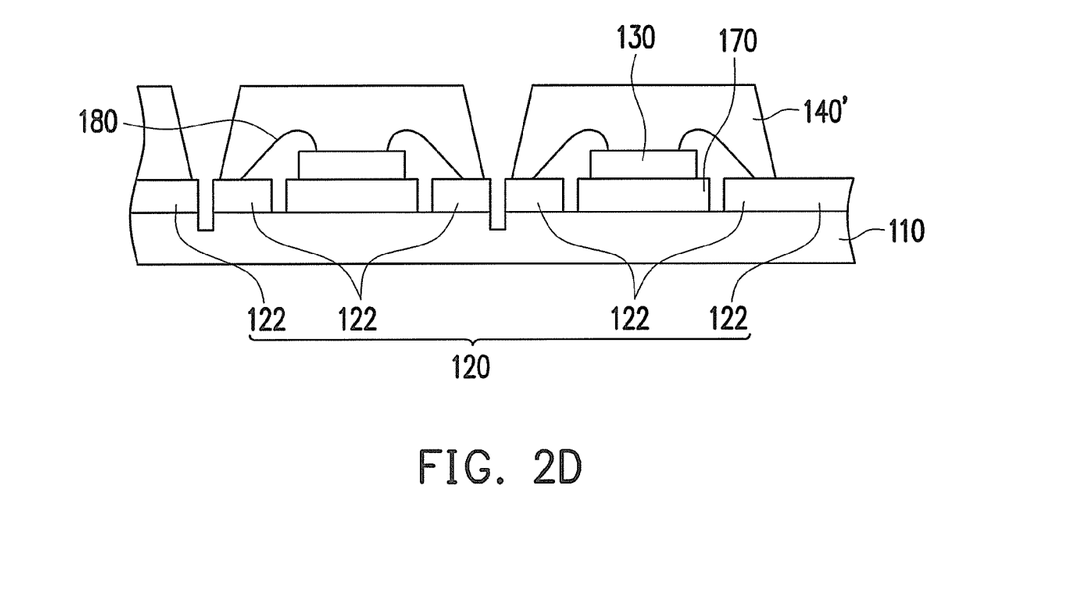
Figure 2E:
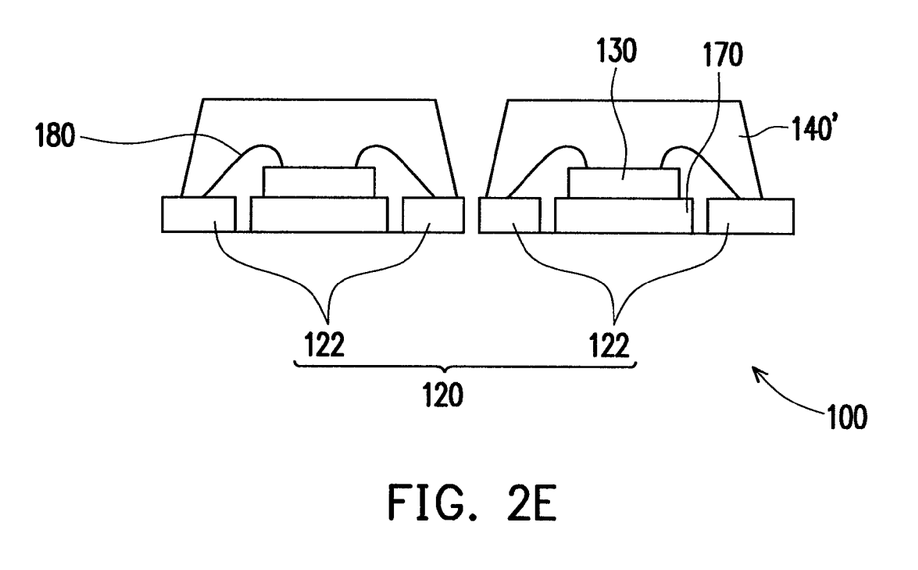

Next, referring to FIGS. 2D and 2E, the patterned conductive layer 120 is cut, and the sacrificial layer 110 is removed after the patterned conductive layer 120 is cut, so as to form a plurality of QFN packages 100.

In the present embodiment, the use of a molding compound is economized by forming a plurality of molding compounds 140' respectively covering the patterned conductive layer 120 and the chips 130. Moreover, since only the patterned conductive layer 120 is needed to be cut, abrasion of the cutting tools can be reduced.

Figure 3A:
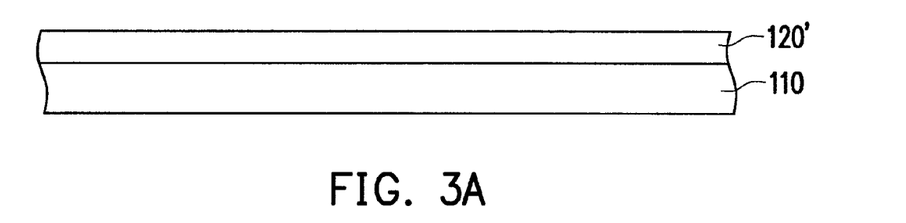
FIGS. 3A and 3B are schematic cross-sectional views illustrating a method of forming a patterned conductive layer depicted in FIGS. 1A and 2A.
Figure 3B:
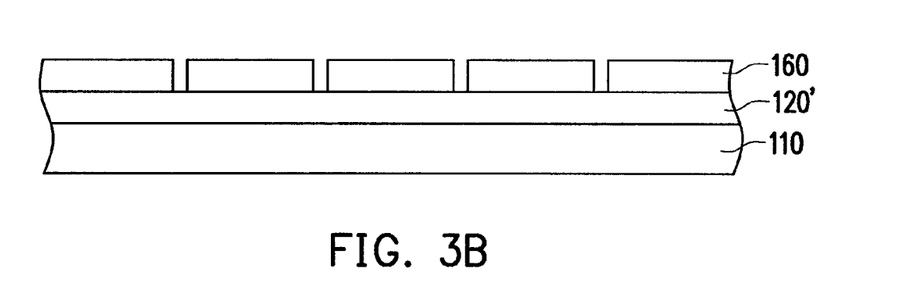

FIGS. 3A and 3B are schematic cross-sectional views illustrating a method of forming a patterned conductive layer depicted in FIGS. 1A and 2A. Referring to FIG. 3A, the method of forming the patterned conductive layer 120 depicted in FIGS. 1A and 2A includes forming a conductive layer 120' on the sacrificial layer 110 at first. Next, referring to FIG. 3B, a patterned photoresist layer 160 is formed on the conductive layer 120'. A portion of the conductive layer 120' that is not covered by the patterned photoresist layer 160 is removed by performing a photolithography/etching process with use of the patterned photoresist layer 160 as a mask. The patterned photoresist layer 160 is then removed for forming the patterned conductive layer 120 depicted in FIGS. 1A and 2A.

Figure 4A:
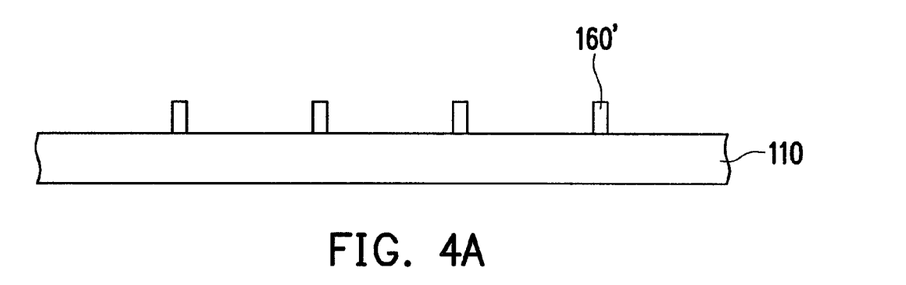
FIGS. 4A and 4B are schematic cross-sectional views illustrating another method of forming the patterned conductive layer depicted in FIGS. 1A and 2A.
Figure 4B:
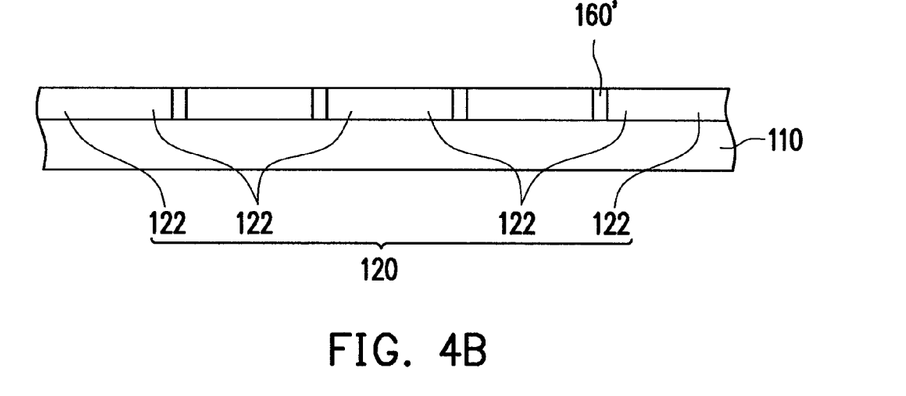

FIGS. 4A and 4B are schematic cross-sectional views illustrating another method of forming the patterned conductive layer depicted in FIGS. 1A and 2A. Referring to FIG. 4A, the method of forming the patterned conductive layer 120 depicted in FIGS. 1A and 2A can also include forming a patterned photoresist layer 160' on the sacrificial layer 110. Next, as indicated in FIG. 4B, the patterned conductive layer 120 depicted in FIGS. 1A and 1B is formed on a portion of the sacrificial layer 110 with use of the patterned photoresist layer 160' as a mask. Here, the portion of the sacrificial layer 110 is not covered by the patterned photoresist layer 160'. After that, the patterned photoresist layer 160' is removed. The sacrificial layer 110 is a metal layer, an insulating layer, or a glass layer. Moreover, a method of forming the patterned conductive layer 120 depicted in FIGS. 1A and 2A on the portion of the sacrificial layer 110 that is not covered by the patterned photoresist layer 160' includes performing an electroplating process.

Referring to FIGS. 1B and 2B, in the previous embodiments, a die pad 170 is further formed when the lead sets 122 are formed, and the leads 122 surround the die pad 170. Each of the chips 130 is electrically connected to one of the corresponding lead sets 122 through a plurality of conductive wires 180. Nonetheless, the die pad 170 does not pose a limitation to the present invention. Namely, the QFN packages 100 can also be formed without forming the die pad 170.

In light of the foregoing, each of the molding compounds connected to the sacrificial layer after the cutting process is performed is attached to the transferring substrate according to the present invention, such that relative positions of each of the molding compounds can be maintained during the removal of the sacrificial layer. Thereby, a plurality of regularly arranged QFN packages are formed, and subsequent fabricating processes can proceed successfully. Moreover, in the present invention, the use of the molding compound is economized by forming a plurality of molding compounds respectively covering the patterned conductive layer and the chips. In addition, since only the patterned conductive layer is needed to be cut, abrasion of the cutting tools can be reduced, and thereby the manufacturing costs can also be lowered down.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a quad flat non-leaded package, comprising:
    forming a patterned conductive layer on a sacrificial layer, wherein the patterned conductive layer comprises a plurality of lead sets constituted by leads;
    attaching a plurality of chips to the sacrificial layer, wherein each of the chips is surrounded by said one of the lead sets, respectively;
    electrically connecting each of the chips to one of the lead sets;
    forming a molding compound on the sacrificial layer, the molding compound covering the patterned conductive layer and the chips;
    cutting and singulating the molding compound and the patterned conductive layer and partially cutting the sacrificial layer to form a plurality of recesses on the sacrificial layer;
    attaching a transferring substrate on the cut and singulated molding compound;
    removing the sacrificial layer; and
    removing the transferring substrate from the cut and singulated molding compound.

2. The method of fabricating the quad flat non-leaded package as claimed in claim 1, wherein a method of forming the patterned conductive layer comprises:
    forming a conductive layer on the sacrificial layer; and
    removing a portion of the conductive layer to form the patterned conductive layer.

3. The method of fabricating the quad flat non-leaded package as claimed in claim 2, wherein a method of removing the portion of the conductive layer comprises performing a photolithography/etching process.

4. The method of fabricating the quad flat non-leaded package as claimed in claim 1, wherein a method of forming the patterned conductive layer comprises:
    forming a patterned photoresist layer on the sacrificial layer;
    forming the patterned conductive layer on a portion of the sacrificial layer with use of the patterned photoresist layer as a mask, wherein the portion of the sacrificial layer is not covered by the patterned photoresist layer; and
    removing the patterned photoresist layer.

5. The method of fabricating the quad flat non-leaded package as claimed in claim 4, wherein the sacrificial layer is a metal layer or an insulating layer.

6. The method of fabricating the quad flat non-leaded package as claimed in claim 4, wherein a method of forming the patterned conductive layer on the portion of the sacrificial layer not covered by the patterned photoresist layer comprises performing an electroplating process.

7. The method of fabricating the quad flat non-leaded package as claimed in claim 1, further comprising forming a die pad during the formation of the lead sets, wherein the leads surround the die pad.

8. The method of fabricating the quad flat non-leaded package as claimed in claim 1, wherein each of the chips and one of the corresponding lead sets are electrically connected through a plurality of conductive wires.

9. The method of fabricating the quad flat non-leaded package as claimed in claim 1, wherein the molding compound is formed on the entire sacrificial layer.

10. A method of fabricating a quad flat non-leaded package, comprising:
    forming a patterned conductive layer on a sacrificial layer, wherein the patterned conductive layer comprises a plurality of lead sets constituted by leads;
    attaching a plurality of chips to the sacrificial layer, wherein each of the chips is surrounded by said one of the lead sets, respectively;
    electrically connecting each of the chips to one of the lead sets;
    forming a plurality of molding compounds on the sacrificial layer, the molding compounds respectively covering the patterned conductive layer and the chips;
    cutting and singulating the patterned conductive layer and partially cutting the sacrificial layer to form a plurality of recesses on the sacrificial layer; and removing the sacrificial layer after the patterned conductive layer is cut and singulated and the sacrificial layer is partially cut.

11. The method of fabricating the quad flat non-leaded package as claimed in claim 10, wherein a method of forming the patterned conductive layer comprises:

forming a conductive layer on the sacrificial layer; and removing a portion of the conductive layer to form the patterned conductive layer.

12. The method of fabricating the quad flat non-leaded package as claimed in claim 11, wherein a method of removing the portion of the conductive layer comprises performing a photolithography/etching process.

13. The method of fabricating the quad flat non-leaded package as claimed in claim 10, wherein a method of forming the patterned conductive layer comprises:

forming a patterned photoresist layer on the sacrificial layer;

forming the patterned conductive layer on a portion of the sacrificial layer with use of the patterned photoresist layer as a mask, wherein the portion of the sacrificial layer is not covered by the patterned photoresist layer; and removing the patterned photoresist layer.

14. The method of fabricating the quad flat non-leaded package as claimed in claim 13, wherein the sacrificial layer is a metal layer, an insulating layer, or a glass layer.

15. The method of fabricating the quad flat non-leaded package as claimed in claim 13, wherein a method of forming the patterned conductive layer on the portion of the sacrificial layer not covered by the patterned photoresist layer comprises performing an electroplating process.

16. The method of fabricating the quad flat non-leaded package as claimed in claim 10, further comprising forming a die pad during the formation of the lead sets, wherein the leads surround the die pad.

17. The method of fabricating the quad flat non-leaded package as claimed in claim 10, wherein each of the chips and one of the corresponding lead sets are electrically connected through a plurality of conductive wires.

* * * * *